United States Patent
Martius et al.

(10) Patent No.: US 9,733,321 B2
(45) Date of Patent: Aug. 15, 2017

(54) MAGNETIC RESONANCE TOMOGRAPHY APPARATUS

(71) Applicants: Sebastian Martius, Forchheim (DE); Markus Vester, Nürnberg (DE)

(72) Inventors: Sebastian Martius, Forchheim (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1172 days.

(21) Appl. No.: 13/854,928

(22) Filed: Apr. 1, 2013

(65) Prior Publication Data
US 2013/0257433 A1 Oct. 3, 2013

(30) Foreign Application Priority Data

Apr. 2, 2012 (DE) .................. 10 2012 205 333

(51) Int. Cl.
*G01R 33/34* (2006.01)
*G01R 33/36* (2006.01)
*G01R 33/3415* (2006.01)

(52) U.S. Cl.
CPC ......... *G01R 33/34* (2013.01); *G01R 33/3692* (2013.01); *G01R 33/3415* (2013.01); *G01R 33/34015* (2013.01)

(58) Field of Classification Search
CPC ............ G01R 33/3621; G01R 33/3415; G01R 33/3692; G01R 33/36; G01R 33/34; G01R 33/34015; G01R 33/341
See application file for complete search history.

(56) References Cited

U.S. PATENT DOCUMENTS

| 4,161,755 A | 7/1979 | Haendle et al. |
| 4,578,646 A | 3/1986 | Maio et al. |

(Continued)

FOREIGN PATENT DOCUMENTS

| DE | 10219749 A1 | 11/2003 |
| DE | 102005022551 A1 | 11/2006 |

(Continued)

OTHER PUBLICATIONS

Chinese Office action for related Chinese Application No. 2014100033289, dated Dec. 18, 2015, with English Translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A magnetic resonance tomography apparatus includes a receiving device having a number of magnetic resonance receive antennas for receiving a magnetic resonance signal in response to a radio frequency signal transmitted at a magnetic resonance frequency. A respective magnetic resonance receive antenna is connected to a parametric mixer. A receive circuit formed hereby is provided inside the cryostat and is coupled via a contactless communication interface to an evaluation circuit provided outside the cryostat. The evaluation circuit includes a local oscillator device for generating an auxiliary signal at an auxiliary frequency. The auxiliary signal is transmitted via the contactless communication interface to the receive circuit. The receive circuit is configured such that a mixed signal having a mixed frequency is generated via the parametric mixer from the auxiliary signal and the magnetic resonance signal and transmitted via the contactless communication interface to the evaluation circuit.

20 Claims, 2 Drawing Sheets

(56) References Cited

U.S. PATENT DOCUMENTS

| | | |
|---|---|---|
| 5,748,701 A | 5/1998 | Mika et al. |
| 6,906,520 B2 | 6/2005 | Heid et al. |
| 7,417,433 B2 | 8/2008 | Heid et al. |
| 8,026,721 B2 | 9/2011 | Sodickson et al. |
| 2007/0013376 A1* | 1/2007 | Heid ................ A61B 5/055 324/309 |
| 2010/0213939 A1* | 8/2010 | Sodickson ......... G01R 33/3415 324/309 |
| 2011/0059716 A1* | 3/2011 | Cork ................ G01R 33/3692 455/330 |
| 2011/0109315 A1* | 5/2011 | Biber ................ G01R 33/3692 324/318 |

FOREIGN PATENT DOCUMENTS

| | | |
|---|---|---|
| JP | H10134992 A | 5/1998 |
| JP | 2000260594 A | 9/2000 |
| SU | 860356 A1 | 8/1981 |
| WO | WO 2010097375 A2 | 1/2011 |

OTHER PUBLICATIONS

German Office Action dated Nov. 30, 2012 for corresponding German Patent Application No. DE 10 2012 205 333.6 with English translation.

Maritius S. et al., "Wireless Local Coil Transmission Using a Parametric Upconverter," Intl. Proc. Soc. Mag. Reson. Med., vol. 17, p. 2934, 2009.

* cited by examiner

MAGNETIC RESONANCE TOMOGRAPHY APPARATUS

This application claims the benefit of DE 10 2012 205 333.6, filed on Apr. 2, 2012, which is hereby incorporated by reference.

BACKGROUND

The present embodiments relate to a magnetic resonance tomography apparatus that is used for examining an object based on the principle of nuclear spin resonance.

Magnetic resonance tomography apparatuses (e.g., nuclear spin tomography apparatuses) include imaging devices by which the spins of atomic nuclei are aligned and excited in order thereby to generate images of the tissue under investigation. A static background magnetic field is generated in a magnetic resonance tomography apparatus for that purpose. Radio frequency signals are transmitted at the known Larmor frequency that is dependent, for example, on the material under investigation and the magnetic field strength of the static background field. After the radio frequency signals are switched off, a magnetic resonance signal is received via corresponding magnetic resonance receive antennas in the system, and images of the internal structure of the examined object are generated in a known manner based on the evaluation of the magnetic resonance signal.

Arrays including local coils may be employed as magnetic resonance receive antennas in conventional magnetic resonance tomography apparatuses in order to optimize the signal-to-noise ratio and the examination time. In this context, local coils are antennas that are attached close to the body or to the part of the body of the patient that is to be examined, and the magnetic resonance signals are acquired from inside the body. The recorded signals are forwarded to the evaluation system of the imaging device.

The use of local coils as magnetic resonance receive antennas has the disadvantage that the use includes a considerable amount of additional time for attaching the coils to the patient. Local coils are uncomfortable and constricting for the patient, making examinations more protracted or even impossible. The cabling of the local coils is complicated and laborious, is susceptible to wear and tear, and constitutes a risk for the patient if insulation measures are inadequate, or the sheath currents are not adequately suppressed.

In order to circumvent the above-described problems, it is known from the prior art to utilize magnetic resonance tomography apparatuses having a "remote body array" that includes a plurality of magnetic resonance receive antennas arranged at a distance from the body (e.g., no longer in direct contact with the body of the patient). A magnetic resonance tomography apparatus having an array of magnetic resonance receive antennas remote from the body is disclosed in the publication WO 2010/097375 A2.

SUMMARY AND DESCRIPTION

In order to reduce the inherent noise of the magnetic resonance receive antennas that is dominant in remote body arrays, the remote body array may be arranged in a cryostat for cooling purposes.

A problem with magnetic resonance tomography apparatuses having remote body magnetic resonance receive antennas cooled by a cryostat is in the coupling-out of the signals, since embodying corresponding cable feedthroughs in the cryostat for the purpose of reading out the signals may be technically difficult. The signals of the magnetic resonance receive antennas may be read out inductively. For this purpose, however, a second antenna located outside of the cryostat is used. This has the disadvantage that this will detrimentally affect the quality or sensitivity of the magnetic resonance receive antennas in the interior of the cryostat.

The present embodiments may obviate one or more of the drawbacks or limitations in the related art. For example, a magnetic resonance tomography apparatus with magnetic resonance signals that may be read out via a remote body receiving device having a high signal-to-noise ratio is provided.

The magnetic resonance tomography apparatus includes a receiving device including a number of magnetic resonance receive antennas (e.g., a plurality of magnetic resonance receive antennas) for receiving a magnetic resonance signal in response to a radio frequency signal transmitted at a magnetic resonance frequency (e.g., the Larmor frequency). The receiving device includes a housing in which the number of magnetic resonance receive antennas are arranged in a cryostat. In order to examine an object (e.g., a patient), the receiving device and the object may be positioned relative to each other at a distance between the housing and the object. The magnetic resonance tomography apparatus accordingly acquires the magnetic resonance signals via magnetic resonance receive antennas that are arranged at a distance and therefore remotely from the object.

The magnetic resonance tomography apparatus is configured such that a respective magnetic resonance receive antenna is connected to a parametric mixer (e.g., a parametric converter), the receive circuit formed hereby being provided inside the cryostat and being coupled via a contactless communication interface to an evaluation circuit provided outside of the cryostat. The evaluation circuit includes a local oscillator device for generating an auxiliary signal (e.g., a local oscillator signal) at an auxiliary frequency. The auxiliary signal is transmitted via the contactless communication interface to the receive circuit. The receive circuit is configured, for example, such that a mixed signal having a mixed frequency is generated via the parametric mixer from the auxiliary signal and the magnetic resonance signal and transmitted via the contactless communication interface to the evaluation circuit. The evaluation circuit processes the signal further in an appropriate manner in order to extract the information of the magnetic resonance signal from the mixed signal so that the corresponding images of the internal structure of the object to be examined may be generated.

The magnetic resonance signals of magnetic resonance receive antennas located in a cryostat are amplified by a parametric mixer, and the magnetic resonance signals are converted into a different frequency range. The parametric mixer is also arranged in the cryostat. Contactless readout of the signals is achieved in this way, so no feedthroughs are to be provided in the cryostat. The signal-to-noise ratio of the read-out signal is maintained as a result of the amplification by the low-noise parametric mixer. In one embodiment, the parametric mixer is positioned in the cryostat and consequently has a very small noise number. The parametric mixer is supplied with power via the energy of the contactlessly transmitted auxiliary signal by which the mixed signal is also generated.

In one embodiment, the magnetic resonance tomography apparatus operates at a Larmor frequency of 123.2 MHz with a main magnetic field having a field strength of 3 tesla.

The magnetic resonance tomography apparatus may also operate at a magnetic resonance frequency of 63.6 MHz with a magnetic field strength of the main magnetic field of 1.5 tesla. Other embodiments of magnetic resonance tomography apparatuses may also be provided. In one embodiment, the auxiliary signal lies at a frequency greater than the magnetic resonance frequency. The greater the frequency, the smaller the antennas used for the contactless communication interface may be dimensioned. Accordingly, greater frequencies have the advantage that the communication interface between the receive circuit and the evaluation circuit may be embodied in compact form. Higher frequencies also result in a higher stable amplification of the parametric converter.

The use of parametric mixers or converters for signal amplification is known from the prior art. The use of parametric converters for reading out signals of magnetic resonance receive antennas positioned close to the body is described in the publication DE 102 19 749 A1, the entire disclosure of which is hereby incorporated by reference into the content of the present application. The circuits described in DE 102 19 749 A1 may also be used in the magnetic resonance tomography apparatus according to one or more of the present embodiments.

The parametric mixer assigned to the respective magnetic resonance receive antenna may include one or more varactor diodes for at least some of the magnetic resonance receive antennas. For example, the mixer may be embodied as a single-diode mixer, a two-diode mixer, or a four-diode mixer. The varactor diodes enable a nonlinear reactance, by which the signal amplification or signal conversion is achieved in a simple manner.

In a further embodiment, the contactless communication interface between the receive circuit and the evaluation circuit that are assigned to the respective magnetic resonance receive antenna is formed for at least some of the magnetic resonance receive antennas by a single integrated transmit and receive antenna in the receive circuit and a single integrated transmit and receive antenna in the evaluation circuit. Both the auxiliary signal directed to the receive circuit and the mixed signal directed to the evaluation circuit are transmitted via the two transmit and receive antennas. In this variant, a simple implementation of the contactless interface is achieved using just two antennas.

In a further embodiment of the magnetic resonance tomography apparatus, the contactless communication interface between the receive circuit and the evaluation circuit that are assigned to the respective magnetic resonance receive antenna is formed for at least some of the magnetic resonance receive antennas by a separate transmit antenna and a separate receive antenna on the receive circuit side and by a separate transmit antenna and a separate receive antenna on the evaluation circuit side. In this case, the auxiliary signal is transmitted by the transmit antenna on the evaluation circuit side and received by the receive antenna on the receive circuit side. Analogously, the mixed signal is transmitted by the transmit antenna on the receive circuit side and received by the receive antenna on the evaluation circuit side. A flexible embodiment of the contactless communication interface may be achieved with this variant.

A broadband auxiliary signal having a plurality of auxiliary frequencies may also be transmitted via the transmit antenna of the evaluation circuit. The broadband auxiliary signal is received by a single broadband receive antenna and supplied via filter circuits to the corresponding parametric converters for signal mixing. In this case, a plurality of evaluation circuits share a common transmit antenna for the auxiliary signal. Similarly, a plurality of receive circuits share a common receive antenna for the auxiliary signal.

In a further embodiment of the magnetic resonance tomography apparatus, the evaluation circuit for at least some of the magnetic resonance receive antennas includes a first filter for allowing the mixed frequency to pass. A mixer is operable to mix the signal that passed the first filter with the auxiliary signal. The mixed signal is supplied to a second filter in order to allow the magnetic resonance frequency to pass through. The signal generated hereby includes the information of the original magnetic resonance signal and may be processed further in a suitable manner in a processing unit for imaging.

A third filter may also be provided in order to allow the auxiliary frequency to pass through in a signal branch via which the auxiliary signal is supplied to the mixer. It is thus provided that only the signal having the auxiliary frequency is used for mixing with the signal from the first filter.

In one embodiment, a single continuous cryostat is provided for all the magnetic resonance receive antennas having associated receive circuits, thereby achieving an efficient cooling of the components. In a further embodiment, cryostats that cool using helium and/or nitrogen are used. The electromagnet for generating the main magnetic field of the magnetic resonance tomography apparatus may be superconducting and is likewise cooled by helium. In one embodiment, the helium used for cooling the electromagnet may accordingly also be used for the cryostat.

In a further embodiment, the housing of the receiving device of the magnetic resonance tomography apparatus serves to form a tube into which the object that is to be examined is positioned. The magnetic resonance receive antennas are arranged together with associated receive circuits in the housing, both in the longitudinal direction and in the circumferential direction of the tube inside the cryostat, which is part of the tube. The tube may be embodied in the form of a cylinder. An internal diameter of the cylinder may be between 40 cm and 100 cm (e.g., between 60 cm and 80 cm for remote body acquisition of the magnetic resonance signals).

The radio frequency signals generated in the magnetic resonance tomography apparatus that lead to the generation of the magnetic resonance signals may be transmitted by a separate transmit device. At least some of the magnetic resonance receive antennas may be used also as transmit antennas for transmitting the radio frequency signal.

In the magnetic resonance tomography apparatus, loop antennas may be used as magnetic resonance receive antennas. In this case, the loop antennas may be, for example, capacitively shortened rings and/or self-resonant rings. Both types of loop antennas are known from the prior art.

In a variant of the magnetic resonance tomography apparatus, twenty to fifty magnetic resonance receive antennas are deployed in order to achieve efficient readout of the magnetic resonance signals.

DETAILED DESCRIPTION

Figure 1:
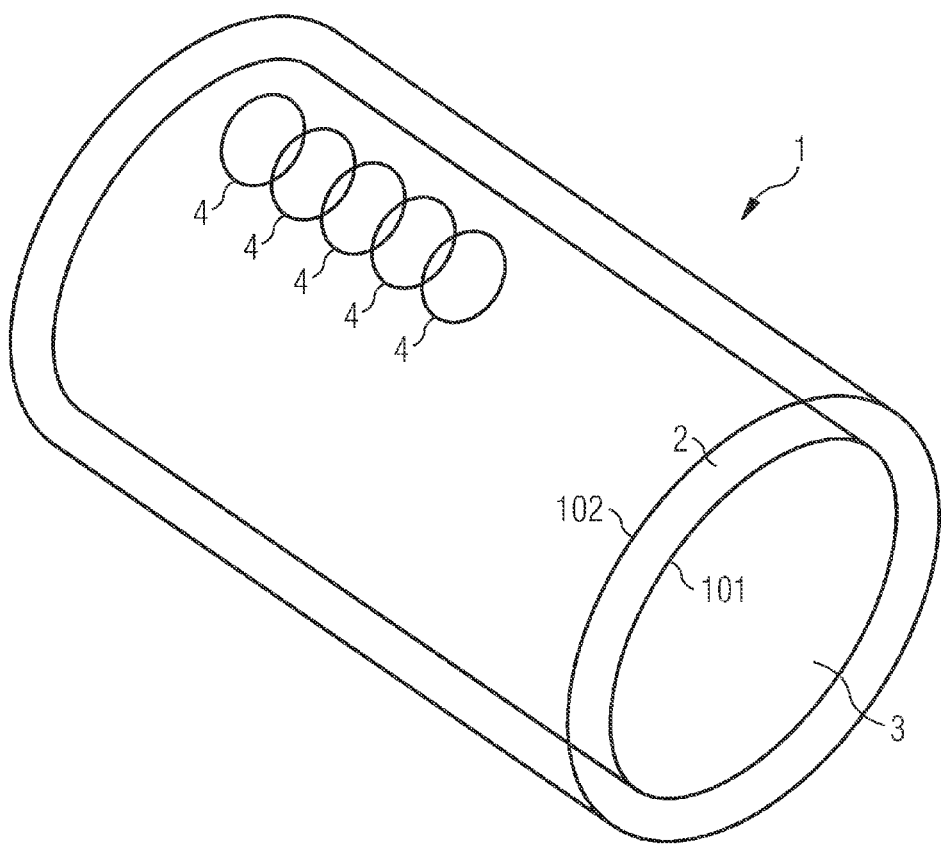
FIG. 1 shows one embodiment of a tube having magnetic resonance receive antennas integrated in the tube of a magnetic resonance tomography apparatus.

FIG. 1 shows a schematic view of a tube or tunnel 1 that is used in an embodiment of a magnetic resonance tomography apparatus for acquisition of magnetic resonance signals. The magnetic resonance tomography apparatus includes, in a known manner, further components that may be provided in the magnetic resonance tomography apparatus, such as, for example, a main magnet for generating the static main magnetic field. Only certain components of the system are explained below.

The tube forms a cylindrical housing having an inner face 101 and an outer face 102. The patient to be examined is introduced into an interior 3 of the cylinder. A plurality of magnetic resonance receive antennas 4 (indicated only schematically in the figure) are installed in the cylinder. Such antennas are provided essentially along the entire circumference of the cylinder. For clarity of illustration reasons, however, corresponding antennas are depicted in one partial area only. The antennas are embodied as loop antennas, with adjacent loop antennas overlapping one another. Embodied between the inner face 101 and the outer face 102 of the tube is a cryostat 2 that effects a cooling of the receive antennas 4 by a suitable cooling medium in order to achieve a lower signal-to-noise ratio. A remote body array composed of receive antennas is created by the tube 1, the magnetic resonance signal being acquired therein without contact with the patient contained in the tube. The structure of the tube may correspond to the tube described in the publication WO 2010/097375 A2, the entire disclosure of which is hereby incorporated by reference into the content of the present application.

In one embodiment, the individual magnetic resonance receive antennas are interconnected with corresponding parametric mixers that are arranged in the cryostat 2. In the embodiment described, a separate parametric mixer is provided for each antenna 4. The parametric mixers are described in more detail below with reference to FIG. 2 and FIG. 3. Parametric mixers are configured to amplify the corresponding signal with very low noise. The parametric mixers are arranged in the cryostat, thereby reducing the noise of the mixers further.

Figure 2:
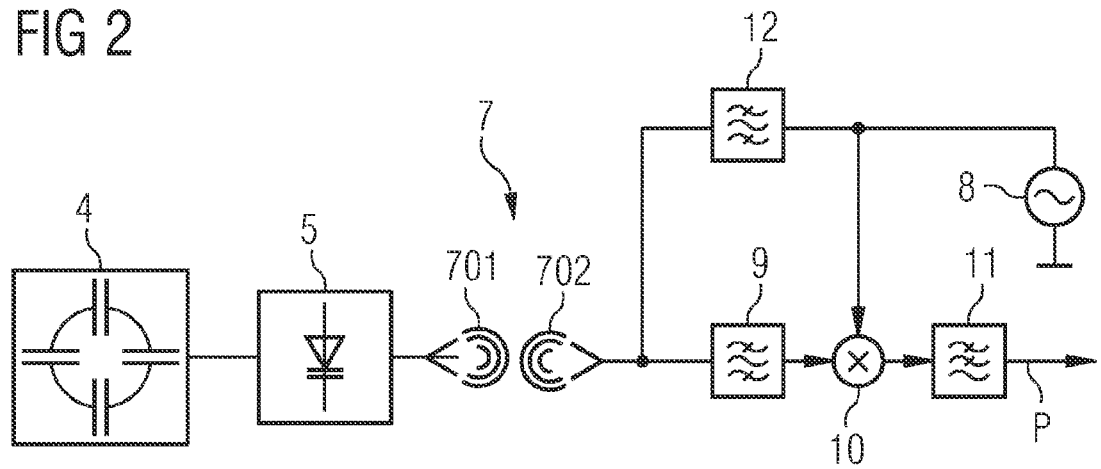
FIG. 2 and FIG. 3 show two variants of receive and evaluation circuits for a magnetic resonance signal used in the magnetic resonance tomography apparatus.

FIG. 2 shows a first embodiment of a circuit for reading out the magnetic resonance signals of a single loop antenna 4. The magnetic resonance signal received by the loop antenna 4 is supplied to the parametric mixer 5, which includes a known varactor diode. Connected downstream of the diode is an antenna 701 that operates as an integrated transmit and receive antenna. The arrangement composed of the antenna 4, the parametric mixer 5 and the antenna 701, for example, forms a receive circuit that is disposed inside the cryostat 2.

Outside the cryostat (e.g., on the outer face 102 of the housing 1), located adjacent to the receive circuit, is an evaluation circuit including an integrated transmit and receive antenna 702, a local oscillator 8, filters 9, 11, 12, and a mixer 10. The local oscillator 8 generates an auxiliary signal at an auxiliary frequency that is higher than the magnetic resonance frequency. For example, the auxiliary frequency lies in the gigahertz range, where the radio frequency signal used to excite the magnetic resonance lies in the region of e.g. 63.6 MHz or 123.2 MHz, depending on the embodiment of the magnetic resonance tomography apparatus. The signal generated by the local oscillator 8 is transmitted via the antenna 702 and received by the antenna 701. The antennas 701 and 702 accordingly form a contactless communication interface 7 between receive circuit and evaluation circuit.

Energy of the auxiliary signal is utilized for operating the parametric mixer 5. An amplification of the originally received magnetic resonance signal and a conversion of the signal into a mixed frequency corresponding to the sum of magnetic resonance frequency and auxiliary frequency are achieved in the parametric mixer using the auxiliary signal. The mixed signal is transmitted by the antenna 701 via the contactless communication interface 7 to the antenna 702. The mixed signal passes via a bandpass filter 9, which is configured to allow the mixed frequency to pass through, to a mixer 10 that converts the signal back into the magnetic resonance frequency range using the auxiliary signal. In this arrangement, a further filter 12 is provided. The further filter 12 only allows the frequency of the auxiliary signal to pass through, so that only the auxiliary frequency is supplied to the mixer 10 along with the mixed frequency. The signal converted into the magnetic resonance frequency range is supplied via a further filter 11, which is a lowpass filter for the magnetic resonance frequency, to a further processing unit (not shown), as indicated by the arrow P. Accordingly, a signal including the original information of the magnetic resonance signal is obtained by the evaluation circuit. The corresponding images of the examined patient are generated from the signal in the further processing unit.

Figure 3:
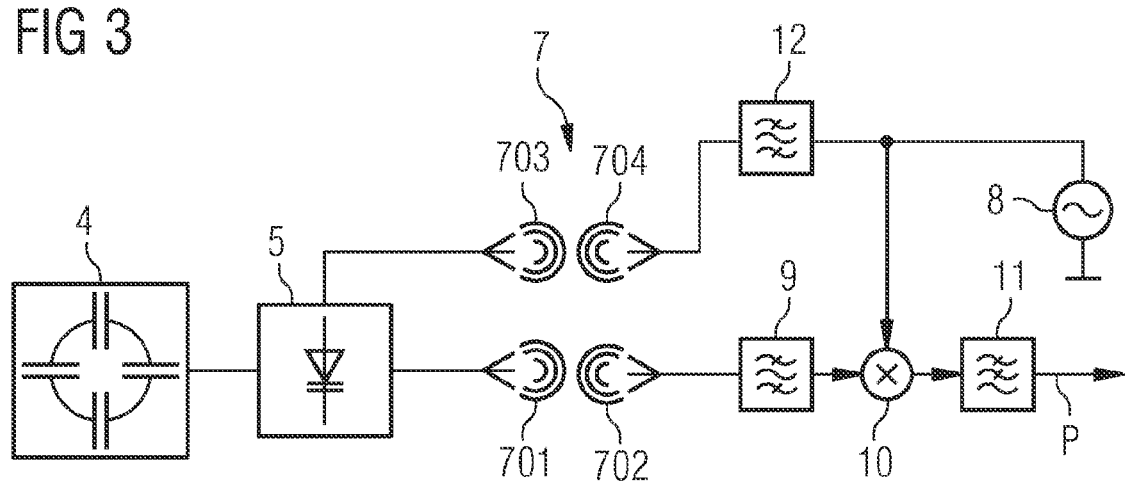

FIG. 3 shows an embodiment of a receive circuit and evaluation circuit that may be employed in the magnetic resonance tomography apparatus. The embodiment of FIG. 3 corresponds in large part to the embodiment variant of FIG. 2, with like or similar components being designated by the same reference signs and not being described a second time unless changed in function and/or structure. In contrast to the embodiment variant of FIG. 2, the contactless communication interface 7 is realized by four antennas 701, 702, 703 and 704. The antenna 701 functions as a transmit-only antenna that transmits the mixed signal generated by the parametric converter. The signal is received by the antenna 702, which functions as a receive-only antenna. The mixed signal is processed further analogously to FIG. 2. In contrast to FIG. 2, the auxiliary signal is transmitted to the parametric converter 5 via two separate antennas 703 and 704. A transmit-only antenna 704 that transmits the mixed signal that is then received by a receive-only antenna 703 on the receive circuit side is provided on the evaluation circuit side. The signal is used analogously to FIG. 2 for signal mixing in the parametric converter 5 as well as for supplying operating energy to the converter.

The embodiments of the invention that have been described hereintofore have a series of advantages. For example, a magnetic resonance tomography apparatus having magnetic resonance receive antennas arranged in a remote body array is provided. The read-out signal of the magnetic resonance tomography apparatus has a very good signal-to-noise ratio. This is achieved through the use of a parametric mixer that is arranged together with the magnetic resonance receive antennas in a cryostat. Simple signal transfer between the parametric mixer and an evaluation circuit is achieved via a contactless communication interface. This provides that there is no need for lines or cables to be laid in the cryostat. Energy is supplied to the parametric converter in this arrangement via an auxiliary signal transmitted via the contactless interface. The investment in terms of circuitry resources used in order to supply the parametric converter is therefore small. The use of low-noise cooled parametric converters also provides that the magnetic resonance receive antennas can be arranged more freely in the cryostat, since they no longer have to be decoupled from one another.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography apparatus comprising:
a receiving device comprising:
a plurality of magnetic resonance receive antennas for receiving a magnetic resonance signal in response to a radio frequency signal transmitted at a magnetic resonance frequency;
a housing, the plurality of magnetic resonance receive antennas being arranged in a cryostat in the housing, wherein the receiving device and an object are positionable relative to each other with a distance between the housing and the object in order to examine the object,
wherein a respective magnetic resonance receive antenna of the plurality of magnetic resonance receive antennas is connected to a parametric mixer, wherein a receive circuit formed by the respective magnetic resonance receive antenna and the parametric mixer is provided inside the cryostat and is coupled via a contactless communication interface to an evaluation circuit provided outside the cryostat, the evaluation circuit comprising a local oscillator device for generating an auxiliary signal at an auxiliary frequency, the auxiliary signal being transmitted via the contactless communication interface to the receive circuit, wherein the receive circuit is configured such that a mixed signal having a mixed frequency is generated via the parametric mixer from the auxiliary signal and the magnetic resonance signal and transmitted via the contactless communication interface to the evaluation circuit, the evaluation circuit operable to process the mixed signal.

2. The magnetic resonance tomography apparatus as claimed in claim 1, wherein for at least some magnetic resonance receive antennas of the plurality of magnetic resonance receive antennas, the parametric mixer of the receive circuit comprises one or more varactor diodes and is configured as a single-diode mixer, a two-diode mixer, or a four-diode mixer.

3. The magnetic resonance tomography apparatus as claimed in claim 1, wherein for at least some magnetic resonance receive antennas of the plurality of magnetic resonance receive antennas, the contactless communication interface between the receive circuit and the evaluation circuit is formed by a single integrated transmit and receive antenna in the receive circuit and a single integrated transmit and receive antenna in the evaluation circuit, both the auxiliary signal being transmitted to the receive circuit and the mixed signal being transmitted to the evaluation circuit via the single integrated transmit and receive antenna in the receive circuit and the single integrated transmit and receive antenna in the evaluation circuit.

4. The magnetic resonance tomography apparatus as claimed in claim 1, wherein for at least some magnetic resonance receive antennas of the plurality of magnetic resonance receive antennas, the contactless communication interface between the receive circuit and the evaluation circuit is formed by a separate transmit antenna and a separate receive antenna on a receive circuit side and by a separate transmit antenna and a separate receive antenna on an evaluation circuit side, the auxiliary signal being transmitted by the transmit antenna on the evaluation circuit side and received by the receive antenna on the receive circuit side, and the mixed signal being transmitted by the transmit antenna on the receive circuit side and received by the receive antenna on the evaluation circuit side.

5. The magnetic resonance tomography apparatus as claimed in claim 1, wherein for at least some magnetic resonance receive antennas of the plurality of magnetic resonance receive antennas, the evaluation circuit comprises a first filter operable to allow the mixed frequency to pass through,
wherein the receiving device further comprises:
a mixer operable to mix a signal that passed the first filter with the auxiliary signal;
a second filter operable to allow the magnetic resonance frequency to pass through, the mixed signal being supplied to the second filter;
a third filter operable to allow the auxiliary frequency to pass through in a signal branch via which the auxiliary signal is supplied to the mixer.

6. The magnetic resonance tomography apparatus as claimed in claim 1, wherein a single cryostat is provided for all magnetic resonance receive antennas of the plurality of magnetic resonance receive antennas with associated receive circuits.

7. The magnetic resonance tomography apparatus as claimed in claim 1, wherein the cryostat is operable to provide a cooling effect using helium, nitrogen, or helium and nitrogen.

8. The magnetic resonance tomography apparatus as claimed in claim 1, wherein a tube into which the object to be examined is positioned is formed by the housing of the receiving device, the plurality of magnetic resonance receive antennas being arranged together with associated receive circuits in the housing in a longitudinal direction and in a circumferential direction of the tube inside the cryostat.

9. The magnetic resonance tomography apparatus as claimed in claim 8, wherein the tube is configured in the form of a cylinder, an inner diameter of the cylinder lying between 40 cm and 100 cm.

10. The magnetic resonance tomography apparatus as claimed in claim 9, wherein the inner diameter of the cylinder lies between 60 cm and 80 cm.

11. The magnetic resonance tomography apparatus as claimed in claim 1, wherein at least some magnetic resonance receive antennas of the plurality of magnetic resonance receive antennas are operative as transmit antennas for transmitting the radio frequency signal.

12. The magnetic resonance tomography apparatus as claimed in claim 1, wherein at least some magnetic resonance receive antennas of the plurality of magnetic resonance receive antennas are loop antennas.

13. The magnetic resonance tomography apparatus as claimed in claim 1, wherein the plurality of magnetic resonance receive antennas comprises between twenty and fifty magnetic resonance receive antennas.

14. The magnetic resonance tomography apparatus as claimed in claim 2, wherein a single cryostat is provided for all magnetic resonance receive antennas of the plurality of magnetic resonance receive antennas with associated receive circuits.

15. The magnetic resonance tomography apparatus as claimed in claim 2, wherein the cryostat is operable to provide a cooling effect using helium, nitrogen, or helium and nitrogen.

16. The magnetic resonance tomography apparatus as claimed in claim 2, wherein a tube into which the object to be examined is positioned is formed by the housing of the receiving device, the plurality of magnetic resonance receive antennas being arranged together with associated receive circuits in the housing in a longitudinal direction and in a circumferential direction of the tube inside the cryostat.

17. The magnetic resonance tomography apparatus as claimed in claim 16, wherein the tube is configured in the form of a cylinder, an inner diameter of the cylinder lying between 40 cm and 100 cm.

18. The magnetic resonance tomography apparatus as claimed in claim 2, wherein at least some magnetic resonance receive antennas of the plurality of magnetic resonance receive antennas are operative as transmit antennas for transmitting the radio frequency signal.

19. The magnetic resonance tomography apparatus as claimed in claim 3, wherein at least some magnetic resonance receive antennas of the plurality of magnetic resonance receive antennas are loop antennas.

20. The magnetic resonance tomography apparatus as claimed in claim 4, wherein at least some magnetic resonance receive antennas of the plurality of magnetic resonance receive antennas are loop antennas.

* * * * *